(12) United States Patent
Dono et al.

(10) Patent No.: US 7,075,852 B2
(45) Date of Patent: Jul. 11, 2006

(54) SEMICONDUCTOR MEMORY DEVICE OF HIERARCHY WORD TYPE AND SUB WORD DRIVER CIRCUIT

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/972,486

(22) Filed: Oct. 26, 2004

(65) Prior Publication Data
US 2005/0088903 A1    Apr. 28, 2005

(30) Foreign Application Priority Data
Oct. 28, 2003    (JP)    ............... 2003-367966

(51) Int. Cl.
*G11C 8/00*    (2006.01)
(52) U.S. Cl. .................. 365/230.06; 365/230.08
(58) Field of Classification Search .......... 365/230.06, 365/230.08, 189.11, 189.01
See application file for complete search history.

(56) References Cited

U.S. PATENT DOCUMENTS

| | | | |
|---|---|---|---|
| 5,640,359 A | | 6/1997 | Suzuki et al. |
| 6,031,779 A | * | 2/2000 | Takahashi et al. .......... 365/226 |
| 6,160,753 A | | 12/2000 | Shibayama |
| 6,469,952 B1 | | 10/2002 | Tsukikawa |
| 6,525,979 B1 | * | 2/2003 | Kato .......................... 365/210 |
| 6,584,031 B1 | * | 6/2003 | Fujisawa et al. ............ 365/226 |
| 6,614,712 B1 | * | 9/2003 | Uchida et al. ......... 365/230.06 |
| 6,765,815 B1 | * | 7/2004 | Fujisawa et al. .............. 365/63 |

FOREIGN PATENT DOCUMENTS

| | | |
|---|---|---|
| JP | 8-063964 | 3/1996 |
| JP | 9-180444 | 7/1997 |
| JP | 11-031384 | 2/1999 |
| JP | 2000-269459 A | 9/2000 |
| JP | 2001-297583 A | 10/2001 |
| JP | 2002-063800 A | 2/2002 |

* cited by examiner

*Primary Examiner*—Gene N. Auduong
(74) *Attorney, Agent, or Firm*—Foley & Lardner LLP

(57) ABSTRACT

In a sub word driver circuit in a semiconductor memory device of a hierarchy word structure using a main word line signal and a sub word line signal, a first NMOS transistor and a first PMOS transistor are connected in series. A second NMOS transistor is connected with a node between the first PMOS transistor and the first NMOS transistor. The source of the first PMOS transistor is connected with a sub word line inverted signal obtained by inverting the sub word line signal, and the source of the first NMOS transistor is connected with a first negative voltage. A single main word line signal is connected to a gate of the first PMOS transistor and a gate of the first NMOS transistor, and the sub word line signal is connected with a gate of the second NMOS transistor.

15 Claims, 10 Drawing Sheets

SEMICONDUCTOR MEMORY DEVICE OF HIERARCHY WORD TYPE AND SUB WORD DRIVER CIRCUIT

BACKGROUND OF THE INVENTION

1. Field of the Invention

The present invention relates to a semiconductor memory device, and more particularly to a sub word driver circuit used for a semiconductor memory device having a hierarchy word structure.

2. Description of the Related Art

In a DRAM (dynamic random access memory) field as an example of a semiconductor memory device, increase of a memory capacity and finer processing go ahead every year and the circuit structure becomes complicated. Therefore, a fault is sometimes incorporated in the manufacturing and design processes, but such a fault is screened by a simple test process. It is effective in cost reduction to improve a refreshing characteristic, which is a basic characteristic of the DRAM, through the screening, in addition to the improvement of the whole chip characteristics.

Under such a situation, it has been studied to decrease boron concentration in a memory cell transistor for improvement of the refreshment characteristic. When the boron concentration is decreased, it is possible to suppress leak current due to crystal defects, but a threshold voltage Vth of the memory cell transistor decreases at the same time and the disturbance-resistance characteristic of the memory cell deteriorates. On the other hand, as the technique for increasing the effective threshold voltage Vth of the memory cell transistor, a negative word system is proposed in which a non-selected word line is set to a negative voltage ($V_{kk}$).

In another viewpoint, the circuit structure of a word driver is improved. One of typical word driver circuits is shown in FIG. 1. Referring to FIG. 1, a NMOS (N-channel MOS transistor) sub word driver has a feature that a layout area is small. However, a CMOS sub word driver is applied in many cases under the consideration of the time shortening a test process such as a long tRAS test through selection of all the word lines. For example, a semiconductor memory device in which the CMOS sub word driver of 2 transistors shown in FIG. 2 is used is disclosed in Japanese Laid Open Patent Application (JP-A-Heisei 8-63964).

In the semiconductor memory device of this conventional example, first and second P-type MOSFETs are connected in parallel between a power supply potential Vcc and a first node, and first and second N-type MOSFET are connected in series between the first node and the ground. Third and fourth P-type MOSFETs are connected in parallel between a high potential Vpp and a second node, and a fifth P-type MOSFET and a third N-type MOSFET are connected in series between the high potential Vpp and a negative potential Vw. The gate of the fifth P-type MOSFET and the gate of the third N-type MOSFET are connected to each other, a node between the gates and the second node are connected, and a fourth N-type MOSFET is provided between the first node and the third node. A connection point between the fifth P-type MOSFET and the third N-type MOSFET is connected with the gate of the fourth P-type MOSFET and the word line. The threshold voltage of the third N-type MOSFET is set to be larger than the threshold voltages of the first, second, and fourth N-type MOSFETs. Thus, in the semiconductor memory device of this conventional example, the word line is set to the negative potential in the non-selection of the memory cells of the DRAM. However, in this negative word system, because an MOS transistor with a high threshold voltage Vth is used as the N-type MOSFET selected in the non-selection of the word line, a delay is caused in the non-selection of the word line.

By the way, in the semiconductor memory device, a hierarchy word system is proposed in accompaniment of increase of the memory capacity. In the hierarchy word system, an NMOS is added to surely establish a non-selected state. Thus, the CMOS sub word driver of this type is composed of 3 transistors, compared with the conventional CMOS sub word driver. A semiconductor integrated circuit apparatus in which a negative word system is applied to a hierarchy word structure is proposed to Japanese Laid Open Patent Application (JP-A-Heisei 11-31384).

In the semiconductor integrated circuit apparatus of this conventional example, when the voltage of a sub word line SWL0 is changed from a high voltage $V_{HH}$ in a selected state to the negative voltage $V_{LL}$, the voltage of the sub word line SWL0 is first changed to the ground voltage $V_{SS}$. The ground voltage $V_{SS}$ is connected with the outside and has enough charge supply ability. Then, the voltage of the sub word line SWL0 is changed to the negative voltage $V_{LL}$ in the non-selected state during a period that a precharging operation is carried out to complimentary bit lines B0* and Bm*. The charge supply ability in the negative voltage $V_{LL}$ is small. In this way, in the conventional semiconductor integrated circuit device, the sub word line SWL0 is set to the negative voltage $V_{LL}$ at high speed without increase of the charge supply ability of an internal negative voltage generating circuit and the voltage change of the internal negative voltage $V_{LL}$ accompanying the voltage change of the sub word line is restrained.

In this way, a control of the word line to the non-selected state in the conventional sub word driver circuit (SWD) using the negative word system adopts a 2-step discharge system, in which the voltage of the word line is first changed to the ground voltage $V_{SS}$ and then to the negative voltage $V_{LL}$. The operation of the sub word driver shown in FIG. 3 in the setting of the word line to the non-selected state will be described below with reference to FIGS. 4A to 4R.

(1) An Operation Example in a Word Line Selection (Word Line Signal SWLT0)

It is supposed that a main word line signal MWLB0, a main word line signal MWLT0, and a sub word line signal FXB0 are set to a ground voltage $V_{SS}$, a negative voltage $V_{KK}$, and a high voltage $V_{PP}$, respectively. At this time, the word line signal SWLT0 is selected. As shown in FIG. 4A, first, the voltage of the main word line signal MWLB0 is changed from the high voltage $V_{PP}$ to the ground voltage $V_{SS}$ to turn on a P-type MOSFET (PMOS) Q31. Subsequently, as shown in FIG. 4B, because the main word line signal MWLT0 is in the negative voltage $V_{KK}$, the NMOS Q32 is kept to the off state. Subsequently, as shown in FIG. 4E, the voltage of the sub word line signal FXB0 is changed from the high voltage $V_{PP}$ to the negative voltage $V_{KK}$. The sub word line signal FXB0 is supplied to the gate of an N-type MOSFET (NMOS) Q33, which is turned off. Also, as shown in FIG. 4F, the voltage of the sub word signal FXT0 is changed from the ground voltage $V_{SS}$ to the voltage $V_{PP}$ by an inverter in response to the voltage change of the sub word line signal FXB0, and the sub word signal FXT0 is supplied to the source of the PMOS Q31. As shown in FIG. 4M, the voltage of the selected word line PSWLT0 is changed to the voltage $V_{PP}$ through the MOS Q31. At this time, the NMOS Q32 has been turned off in order to keep the main word line signal MWL0 to the negative voltage $V_{KK}$.

(2) The Operation Example in Case of the Non-Selection of the Word Line (Word Line Signal SWLT0)

When the main word line signal MWLB0, the main word line signal MWL0, and the sub word signal FXB0 respectively change into voltage $V_{PP}$, $V_{PP}$ and $V_{PP}$ from the word line selection state, and the word line signal SWLT0 is set to the non-selected state. First, as shown in FIG. 4A, the main word line signal MWLB0 changes from the ground voltage $V_{SS}$ to the voltage $V_{PP}$ to turns off PMOS Q31. As shown in FIG. 4B, at substantially the same time, the main word line signal MWL0 changes from the negative voltage $V_{KK}$ to the voltage $V_{PP}$ and the word line FSWLT0 changes to the ground voltage $V_{SS}$ through the NMOS Q32. When the word line goes to the ground voltage $V_{SS}$ sufficiently, the main word line signal MWLT0 changes from the voltage $V_{PP}$ to the negative voltage $V_{KK}$ to turn off the NMOS Q32, as shown in FIG. 4B. In response to this, as shown in FIG. 4E, the sub word signal FXB0 changes from the ground voltage $V_{SS}$ to the voltage $V_{PP}$. Also, as shown in FIG. 4F, the sub word line signal FXT0 changes from the voltage $V_{PP}$ to the voltage $V_{SS}$. Because the sub word signal FXB0 is supplied to the gate of the NMOS Q33, the NMOS Q33 is turned on. The word line FSWLT0 changes to the negative voltage $V_{KK}$ through the NMOS Q33 and the word line FSWLT0 is set to the non-selected state.

In the generation of 1 Gbit DDR I/II, the low skew design (the increase of the I/O line width) is necessary because of the increase of the number of the I/O wiring lines and the achievement of the high-speed operation (the data frequency: 667 MHz). Therefore, the width of the I/O wiring line on the memory array must be expanded. Moreover, to reduce noise at the time of the sense operation, the power supply wiring line width on the array must be sufficiently widened.

As described above, when the 2-step discharge method is applied to the negative word method, the main word line signal MWLB and the main word line signal MWLT become necessary, compared with the sub word driver circuit before the negative word method is applied. Thus, the wiring lines which passes on the array become twice. Therefore, the number of wiring lines on the memory array increases and the wiring line width cannot be widened.

In conjunction with the above description, a word driver circuit is disclosed in Japanese Laid Open Patent Application (JP-A-Heisei 9-180444). The word driver circuit of this conventional example is provided for a memory circuit in which a first power supply and a second power supply higher than it are supplied. A first transistor of a first conductive type is provided, and a second transistor of a second conductive type is provided to have a gate connected with a gate of the first transistor. In the second transistor, one of source and drain electrodes is connected with one of the source and drain electrodes of the first transistor. The other of the source and drain electrodes of the second transistor is connected with the first power supply. A word line is connected with the source or drain electrodes of the first and second transistors which are connected in common. The gates connected in common are supplied with a first signal having one of a first voltage which is generated by decoding a first address signal group and which is set the second transistor to the conductive state, and a second voltage which is lower than a first power supply. The other of the source and drain of the first transistor is supplied with a second signal having one of a third voltage as the selection state voltage of the word line which is generated by decoding a second address signal group and a fourth voltage which is lower than the first power supply. In this way, in the word driver circuit of this conventional example, the sub word driver circuit is simplified and the number of elements and the number of control signals are reduced.

Also, a semiconductor integrated circuit device is disclosed in the Japanese Laid Open Patent Application (JP-P2000-269459A). In the semiconductor integrated circuit device of this conventional example, many MOS transistors and wiring lines are integrated on a semiconductor substrate. The semiconductor integrated circuit device contains main word lines, a plurality of sub word lines branched from the main word lines, a plurality of bit lines provided to intersect the sub word lines, and a memory cell array which is connected with the sub word lines and the bit lines and contains a plurality of memory cells arranged in a matrix. Also, the semiconductor integrated circuit device contains a sense amplifier row which contains a plurality of sense amplifiers connected with each bit line, a main word line drive signal generating circuit to generate a main word line drive signal, a sub word line drive signal generating circuit to generate a sub word line drive signal, and a sub word line non-signal generating circuit which generates a sub word line non-signal. The sub word line drive section is connected with the main word line drive signal generating circuit, the sub word line drive signal generating circuit and the sub word line non-signal generating circuit. The sub word line drive section contains a plurality of sub word line drive circuits to drive each sub word line in accordance with the main word line drive signal, the sub word line drive signal and the sub word line non-signal. Also, the sub word line drive signal has a state that is a boosted voltage higher than an external power supply voltage, and the sub word line non-signal has a state that is the external power supply voltage or an internal lower voltage lower than the external power supply voltage. According to the semiconductor integrated circuit device of this conventional example, the low power consumption is aimed in the word line selection in the semiconductor integrated circuit such as DRAM of the hierarchy word structure and the high integration of the semiconductor integrated circuit is attempted.

Also, a semiconductor memory device is disclosed in Japanese Laid Open Patent Application (JP-P2001-297583A). The semiconductor memory device of this conventional example is composed of a memory array containing a plurality of memory cells arranged in a matrix of rows and columns, a plurality of word lines respectively provided for the rows, a plurality of bit line pairs respectively provided for the columns, and a row decoder which sets a corresponding one of the word lines to a selection level based on an row address signal to activate the memory cells. Also, the semiconductor memory device of this conventional example is composed of a column decoder which selects either one of the plurality of bit line pairs in accordance with a column address signal, and a read/write circuit which carries out read/write of data from/into the memory cell activated by the row decoder through the bit line pair selected by the column decoder. The row decoder is composed of first to third transistors and a signal generating circuit. The first transistor of a first conductive type has first and second electrodes and an input electrode. The first electrode receives a first binary signal which can take a higher voltage which is higher than a power supply voltage and a negative voltage. The second electrode is connected with the corresponding word line. The input electrode receives a second binary signal which can take the higher voltage and the negative voltage. The second transistor of a second conductive type has first and second electrodes and an input electrode. The first electrode receives the negative voltage, the second electrode is connected with the corresponding word line. The third transistor of the second conductive type has first and second electrodes and an input electrode. The first electrode receives the second signal, the second electrode is connected with the input electrode of the second transistor, and the input electrode receives the power supply voltage. The signal generating circuit respectively sets the first and second signals to the higher voltage and the negative voltage in response to application of a previously allocated row address signal to the corresponding word line to set the corresponding word line to the selection level. Thus, the semiconductor memory device of this conventional example can use a lower power supply voltage, and higher reliability is provided.

Also, a test method of many word lines in a semiconductor memory assembly is disclosed in Japanese Laid Open Patent Application (JP-P2002-63800A). In this test method of this conventional example, a plurality of word lines (WL) are powered up to a high voltage, and the active word lines are powered down to a negative VNWL voltage. Inactive word lines are floated in high resistance in a negative voltage VNWL, before the active word lines are powered down. After the active word lines are powered down, all the word lines are connected with the negative voltage VNWL again. Thus, in the conventional method, the multiple WL wafer test can be implemented quickly without being accompanied by a great expense.

SUMMARY OF THE INVENTION

Therefore, an object of the present invention is to provide a semiconductor device that the number of wiring lines can be reduced which pass on a memory array, and a sub word driver used for the same.

Another object of the present invention is to provide a sub word circuit which can prevent a delay at the time of the non-selection of a word line.

Another object of the present invention is to provide a semiconductor device of a hierarchy word structure using a negative word system for improvement of refreshment characteristics and a sub word driver used for the same.

Another object of the present invention is to provide a semiconductor device in which a consumption current in a negative voltage can be reduced without being accompanied by the increase of a manufacturing process, while being simply set to the negative voltage and a sub word driver used for the same.

In an aspect of the present invention, a sub word driver circuit in a semiconductor memory device of a hierarchy word structure using a main word line signal and a sub word line signal, includes a first NMOS transistor and a first PMOS transistor which are connected in series; and a second NMOS transistor which is connected with a node between the first PMOS transistor and the first NMOS transistor. The source of the first PMOS transistor is connected with a sub word line inverted signal obtained by inverting the sub word line signal, and the source of the first NMOS transistor is connected with a first negative voltage. A single main word line signal is connected to a gate of the first PMOS transistor and a gate of the first NMOS transistor, and the sub word line signal is connected with a gate of the second NMOS transistor.

Here, the source of the second NMOS transistor may be connected with the first negative voltage.

Also, it is desirable that the first PMOS transistor is back-biased to a positive voltage corresponding to a high level of the main word line signal, and the first NMOS transistor and the second NMOS transistor are back-biased to a second negative voltage equal to or lower than the first negative voltage.

Also, the first PMOS transistor and the first NMOS transistor may have a first threshold voltage and a second threshold voltage, respectively, and the second NMOS transistor may have a third threshold voltage which is higher than the second threshold voltage. In this case, it is desirable that the second threshold voltage of the second NMOS transistor is substantially equal to a threshold voltage of a transistor in a memory cell.

In another aspect of the present invention, a sub word driver circuit in a semiconductor memory device of a hierarchy word structure using a main word line signal and a sub word line signal, includes a first NMOS transistor and a first PMOS transistor which are connected in series; and a second NMOS transistor connected between a first negative voltage and a node between the first PMOS transistor and the first NMOS transistor. The source of the first PMOS transistor is connected with a sub word line inverted signal obtained by inverting the sub word line. A single main word line signal is connected to a gate of the first PMOS transistor and a gate of the first NMOS transistor and the sub word line signal is connected to a gate of the second NMOS transistor.

Here, the source of the first NMOS transistor may be connected with the first negative voltage.

Also, the first PMOS transistor may be back-biased to a positive voltage corresponding to a high level of the main word line signal, and the first NMOS transistor and the second NMOS transistor may be back-biased to a second negative voltage equal to or lower than the first negative voltage. In this case, it is desirable that the first PMOS transistor and the first NMOS transistor have a first threshold voltage and a second threshold voltage, respectively, and the second NMOS transistor has a third threshold voltage which is higher than the second threshold voltage. In this case, it is desirable that the second threshold voltage of the second NMOS transistor is substantially equal to a threshold voltage of a transistor in a memory cell.

In another aspect of the present invention, a semiconductor memory device includes a decoder which decodes an address to activate one of main word line signals and one of sub word signals for a memory cell sub array; a first inverter which comprises a first PMOS transistor and a first NMOS transistor and which are connected with a first positive voltage, and inverts the activated sub word signal to generate a sub word line inverted signal; a second inverter which comprises a second PMOS transistor and a second NMOS transistor, is connected between the sub word line inverted signal and a first negative voltage, and inverts the activated main word line signal to output an active word line signal which is supplied to the memory cell sub array; and a third NMOS transistor which is connected between the output of the second inverter and the first negative voltage and has a gate receiving the activated sub word line signal.

Here, it is desirable that each of the first and second PMOS transistors is back-biased to the first positive voltage, and each of the first to third NMOS transistors is back-biased to a second negative voltage equal to or lower than the first negative voltage.

Also, the source of the first NMOS transistor may be connected with a ground voltage. In this case, the first and second NMOS transistors may have a first threshold voltage, which is substantially same as that of the first or second PMOS transistor.

Also, the source of the NMOS transistor may be connected with the first negative voltage. In this case, the second NMOS transistor may have a first threshold voltage, and each of the first and third NMOS transistors may have a second threshold voltage which is larger than the first threshold voltage.

Also, the second NMOS transistor may have a first threshold voltage, and the third NMOS transistor may have a second threshold voltage which is larger than the first threshold voltage. In this case, the second threshold voltage of each of the first and third NMOS transistors may be substantially equal to a threshold voltage of a transistor in a memory cell.

Also, the activated main word line signal, the activated sub word signal and the active word line signal may pass on a memory cell array containing the memory cell sub array.

DESCRIPTION OF THE PREFERRED EMBODIMENTS

Figure 5:
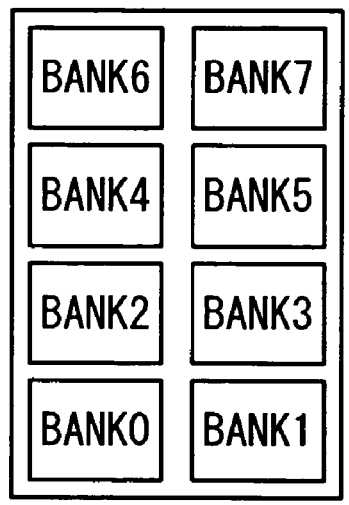
FIG. 5 is a diagram showing the structure of banks in a memory area of a semiconductor memory device of the present invention.

Hereinafter, a semiconductor device containing a semiconductor memory device with a sub word driver circuit of the present invention will be described with reference to the attached drawings. FIG. 5 shows the semiconductor memory device to which the sub word driver circuit of the present invention is applied. As shown in FIG. 5, the semiconductor memory device of the present invention has a memory cell array. The memory cell array has a plurality of banks (BANK), eight banks BANK0 to BANK7 in this example. One of the eight banks BANK0 to BANK7 is specified using a part of an address inputted to the semiconductor memory device. The remaining part of the address is supplied to a specified bank(s). Because this operation is known to a person in the art, the description is omitted.

Figure 6:
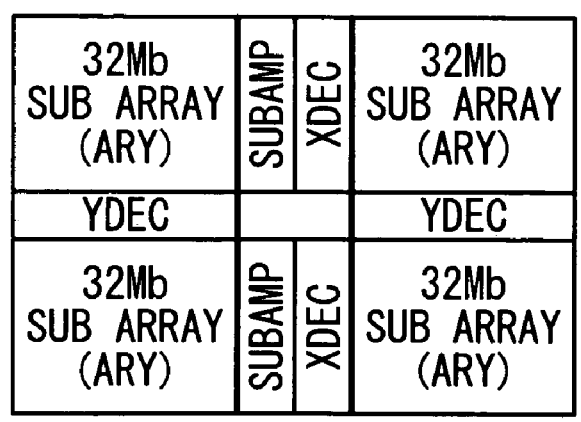
FIG. 6 is a diagram showing a structure of each bank shown in FIG. 5.

FIG. 6 is a diagram showing a structure of each bank in the semiconductor memory device. As shown in FIG. 6, each bank has four sub arrays. A sub amplifier circuit section SUBAMP and an X decoder XDEC are provided in common every two sub arrays. Also, a Y decoder YDEC is provided in common to the four sub arrays. The X decoder XDEC and the Y decoder YDEC decode the address supplied to the bank and specify one or a plurality of memory cells. The sub amplifier circuit SUBAMP, the memory sub array ARY, and the X decoder XDEC are general circuits which are well known to the person in the art. Because these circuits does not relates to the present invention, the detailed description is omitted.

Figure 7:
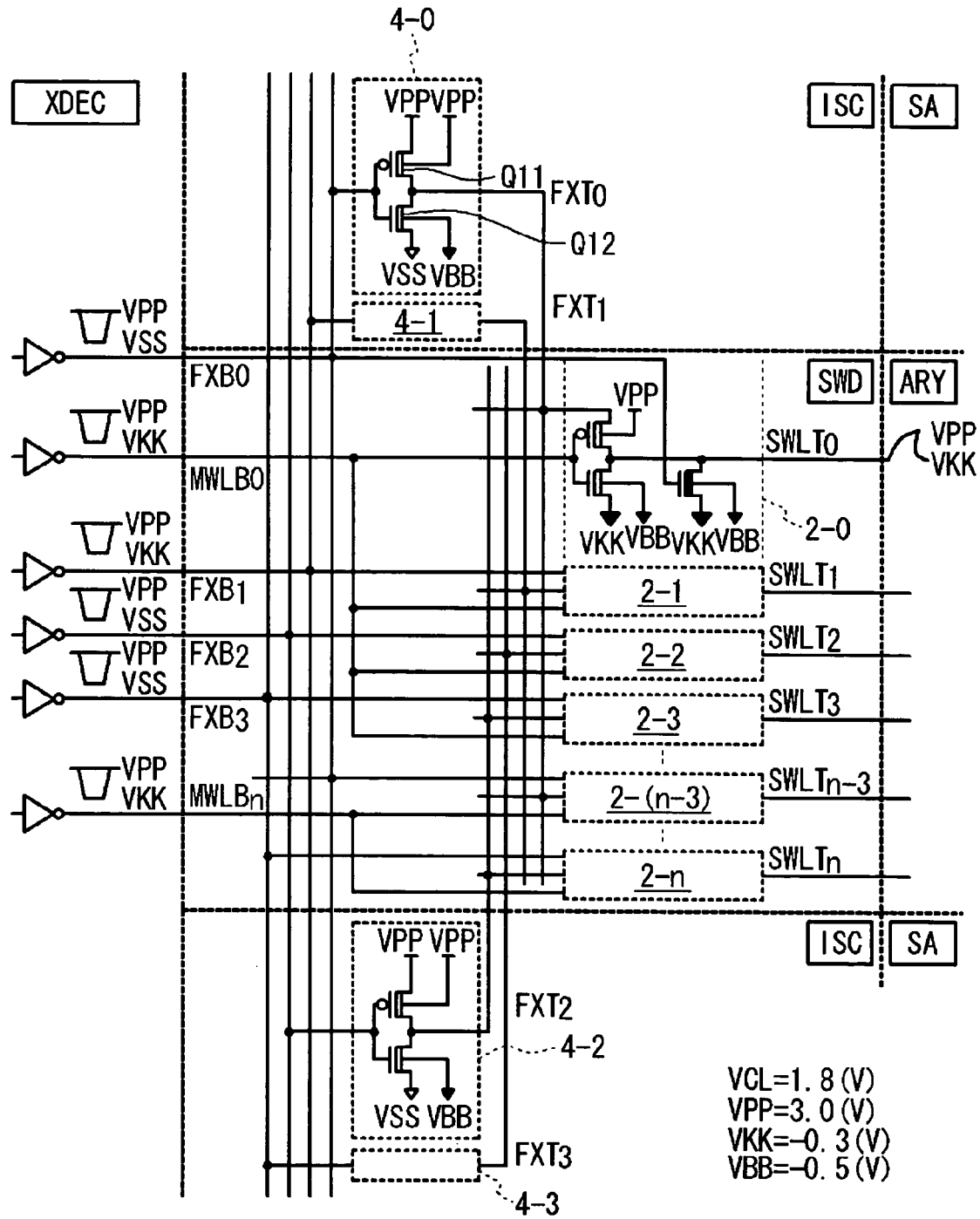
FIG. 7 is a diagram showing a wiring structure of a sub word driver circuit section in the semiconductor memory device according to a first embodiment of the present invention.

FIG. 7 shows the structure of the sub word driver circuit section and its wiring system according to the first embodiment of the present invention. The sub word driver circuit section is provided to one sub array. Referring to FIG. 7, the X decoder XDEC decodes a part of the address which is supplied to the bank and generates main word line signals MWLB0 to MWLBn and sub word line signals FXB0 to FXBm. The main word line signals have the amplitude between a high voltage $V_{PP}$ and the negative voltage $V_{KK}$. Also, the sub word line signal has the amplitude between the high voltage $V_{PP}$ and the ground voltage $V_{SS}$. In this example, the X decoder XDEC decodes the 3 lower bits of the supplied address and generates the sub word line signals FXB0 to FXB7. Of these sub word line signals FXB0 to FXB7, the sub word line signals FXB0 to FXB3 are supplied to the sub word driver circuit section shown in FIG. 7 and the sub word line signals FXB4 to FXB7 of the remainder are supplied to another sub word driver circuit section (not shown) of the sub array. The main word line signals MWLB0 to MWLBn generated by the X decoder XDEC and the sub word line signals FXB0 to FXB3 are supplied to the sub word driver circuit section.

An intersection area (ISC: an area surrounded by a sub word driver SWD and a sense amplifier SA) is arranged around the sub word driver circuit section. Inverters 4-0 to 4-3 are arranged in the intersection area ISC. Because the circuit structures of the inverters are same, only the inverter 4-0 will be described. The inverter 4-0 has a PMOS (P-channel MOSFET) Q11 and an NMOS (N-channel MOSFET) Q12 which are connected in series between the high voltage $V_{PP}$ and the ground voltage $V_{SS}$. The substrate voltage of the PMOS Q11 is back-biased to the high voltage $V_{PP}$ and the substrate voltage of the NMOS Q12 is back-biased to a negative voltage $V_{BB}$. The negative voltage VBB is equal to or lower than the negative voltage $V_{KK}$. The gate of the PMOS Q11 and the gate of the NMOS Q12 are connected and the corresponding sub word line signal FXB0 is supplied. The output of the inverter 4-0 is supplied to the sub word driver circuit section as the sub word line signal FXT0. At this time, the main word line signals MWLB0 to MWLBn and the sub word signals FXB0 to FXB3 pass on the sub array and are supplied to the sub word driver circuit section.

The four sub word driver circuits SWD2-0 to 2-3 are provided for the sub word driver circuit section to each main word line signal. Because the circuit structures of these sub word driver circuits SWD are same, only the sub word driver circuit SWD2-0 will be described. The sub word driver circuit SWD2-0 is supplied with the main word line signal MWLB0 and the sub word line signals FXB0 and FXT0 and outputs the corresponding word line signal SWLT0 which is supplied to the memory cells. The word line signal SWLT0 has the amplitude between the high voltage $V_{PP}$ and the negative voltage $V_{KK}$. In this way, a leak current from the memory cell can be reduced and the refreshment characteristics can be improved.

Figure 8:
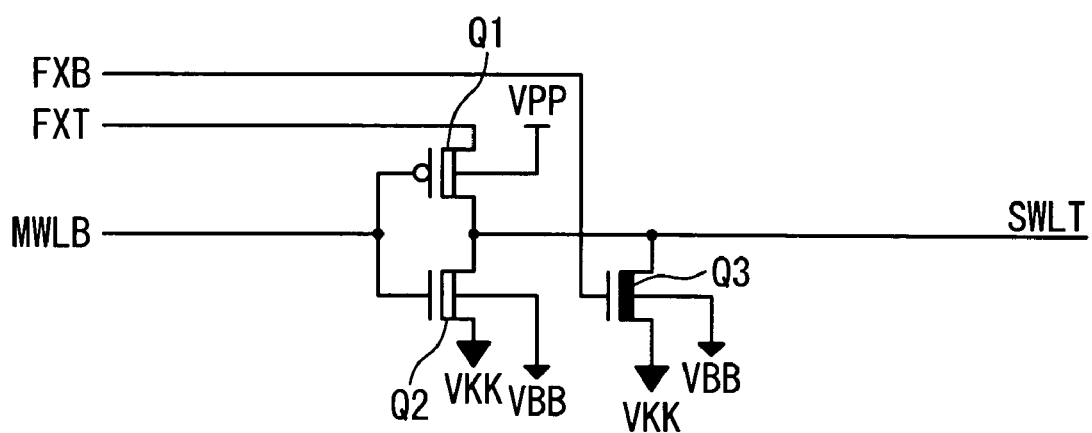
FIG. 8 is a diagram showing the structure of the sub word driver circuit in the first embodiment.

FIG. 8 shows the circuit structure of the sub word driver circuit SWD. The sub word driver circuit SWD2-0 has a PMOS Q1 and an NMOS Q2 which are connected in series. The source of the PMOS Q1 is connected with the sub word line signal FXT0 and the source of the NMOS Q2 is connected with the negative voltage $V_{KK}$. The substrate voltage of the PMOS Q1 is back-biased to the high voltage $V_{PP}$ and the substrate voltage of the NMOS Q2 is back-biased to the same voltage as the negative voltage $V_{KK}$, or the negative voltage $V_{BB}$. The gate of the PMOS Q1 and the gate of the NMOS Q2 are connected and the corresponding main word line signal MWLB0 is supplied. The PMOS Q1 and the NMOS Q2 function as the inverter. The output of the inverter is supplied to the sub array as the word line signal SWLT0 to specify one or a plurality of memory cells.

The sub word driver circuit SWD2-0 has an NMOS Q3 which is connected between the word line signal SWLT0 and the negative voltage $V_{KK}$. The substrate voltage of the NMOS Q3 is biased to the negative voltage $V_{BB}$. The sub word line signal FXB0 is supplied to the gate of the NMOS Q3. The NMOS Q3 has a threshold voltage which is higher than NMOS Q2. Because the NMOS Q3 with the high threshold voltage $V_{th}$ is formed simultaneously with ion implantation of boron to the memory cell transistor, it is not accompanied by the increase of the manufacturing process. The threshold voltage of the NMOS Q3 is approximately equal to the threshold voltage of the transistor (not shown) of the memory cell which is connected with the word line signal SWLT0. Even if the threshold voltage $V_{th}$ is deviated due to change of the ion implantation quantity of boron, there is no problem an operation speed of the NMOS Q3 with the high threshold voltage $V_{th}$ does not influence selection and non-selection of the word line, although the operation speed of the NMOS Q3 varies.

In the sub word driver circuit SWD, an NMOS with the high threshold voltage $V_{th}$ is used as the NMOS Q3 in which a high-speed operation is not required and the sub word line signal FXB0 is supplied to the gate and the voltage of the sub word line signal FXB0 when the logic is low is in the ground voltage $V_{SS}$. Also, because a high-speed operation is required in the operation of the selection/non-selection of the word line, the MOSFET which has a usual threshold voltage $V_{th}$ is used for the PMOS Q1 and the NMOS Q2.

The number of main word line signals becomes a half because the main word line signal MWLT is not used and only the main word line signal MWLB is used in the sub word driver circuit of the present invention, as compared with the conventional example. Therefore, it is possible to widen the wiring line width, namely, the I/O line wiring line or the power supply wiring line which pass on the sub array can be formed to have low resistance. Also, the high-speed data transfer can be achieved, and array noise endurance is improved. Also, because the amplitude of the sub word signal FXB signal changes from the amplitude $V_{PP}$ to $V_{KK}$ to the amplitude $V_{PP}$ to $V_{SS}$, the wiring line capacity of the negative voltage $V_{KK}$ power supply line can be reduced.

Figure 9:
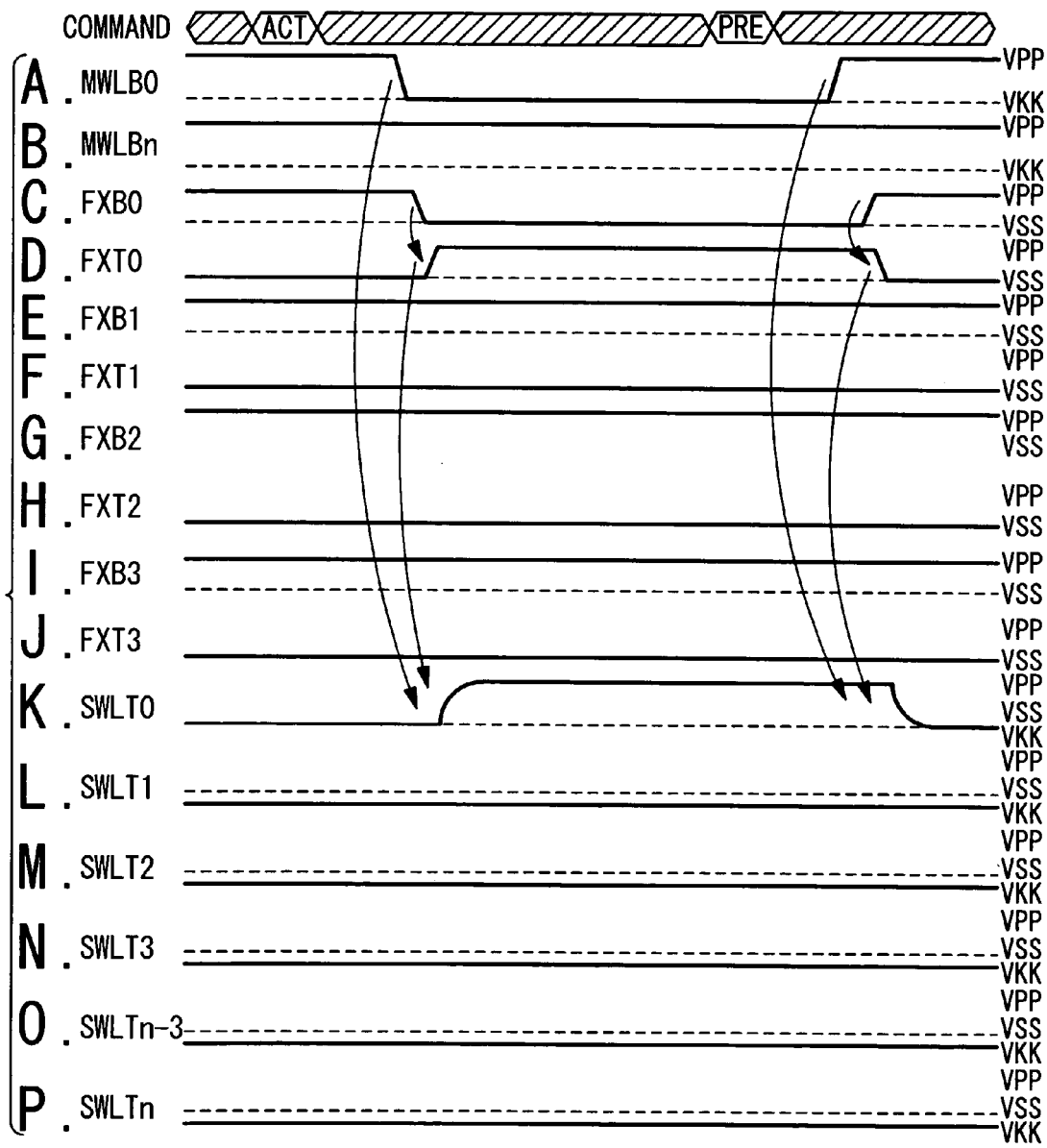
FIGS. 9A to 9P are diagrams showing an operation of the semiconductor memory device according to the first embodiment of the present invention.

Next, the operation of the sub word driver circuit will be described with reference to FIGS. 9A to 9P.

(1) An Operation Example in Selection of the Word Line (Word Line Signal SWLT0)

When the main word line signal MWLB0 and the sub word signal FXB0 are in the negative voltage $V_{KK}$ and the ground voltage $V_{SS}$, respectively, the word line signal SWLT0 is selected. First, as shown in FIG. 9A, the main word line signal MWLB0 is switched from the high voltage $V_{PP}$ to the negative voltage $V_{KK}$. In response to this switching operation, the NMOS Q2 is turned on, and the PMOS Q1 turn off. Subsequently, as shown in FIG. 9C, the sub word signal FXB0 is switched from the high voltage $V_{PP}$ to the ground voltage $V_{SS}$. In response to this switching operation, the sub word line signal FXB0 of the ground voltage $V_{SS}$ is supplied to the gate of the NMOS Q3 and the NMOS Q3 is turned off. Also, as shown in FIG. 9D, the inverter 4-0 arranged in the intersection area (ISC) inverts the sub word line signal FXB0 and changes the voltage of the sub word signal FXT0 from the ground voltage $V_{SS}$ into the high voltage $V_{PP}$. As a result, the sub word signal FXT0 of the high voltage $V_{PP}$ is supplied to the source of the PMOS Q1. Thus, as shown in FIG. 9K, the word line signal SWLT0 is switched to the high voltage $V_{PP}$ through the PMOS Q1, and is set to the selected state. At this time, it is enough that the NMOS Q3 keeps the turned-off state until the voltage of the sub word line signal FXT0 is switched from the ground voltage $V_{SS}$ to the high voltage $V_{PP}$ by the inverter 4-0. Therefore, the word line selection speed is not limited by the NMOS Q3 with the high threshold voltage $V_{th}$.

(2) An Operation Example at the Time of the Non-Selection of the Word Line (Word Line Signal SWLT0)

When the main word line signal MWLB0 and the sub word signal FXB0 change into the voltages $V_{PP}$ and $V_{PP}$ from the word line selection state, the word line signal SWLT0 is set to the non-selected state. First, as shown in FIG. 9A, the main word line signal MWLB0 is switched from the negative voltage $V_{KK}$ to the voltage $V_{PP}$, the PMOS Q1 is turned off and the NMOS Q2 is turned on. As shown in FIG. 9K, the word line signal SWLT0 is switched to the negative voltage VKK by the NMOS Q2 and the word line signal SWLT0 is set to the non-selected state. Subsequently, as shown in FIG. 9C, the sub word signal FXB0 is switched from the ground voltage $V_{SS}$ to the high voltage $V_{PP}$. The sub word signal FXB0 of the high voltage $V_{PP}$ is supplied to the gate of the NMOS Q3 and the NMOS Q3 is turned on. Because the word line signal SWLT0 is already switched to the negative voltage $V_{KK}$ by the NMOS Q2, the word line non-selection speed is not limited by the NMOS Q3 with the high threshold voltage $V_{th}$. That is, there is not a side effect through use of the NMOS Q3 with the high threshold voltage $V_{th}$. Also, the sub word signal FXT0 signal is switched from the high voltage $V_{PP}$ to the ground voltage $V_{ss}$ by the inverter 4-0 arranged at intersection area (ISC) and is supplied to the source of the PMOS Q1.

(3) A Non-Selected State Example 1 of the Other Word Lines (the Word Line Signal SWLT)

When the main word line signal MWLB and the sub word signal FXB are the voltages $V_{PP}$ and $V_{PP}$, the word line signal SWLT is set to the non-selected state, like the case of the above (2). Most of the non-selected word line signals SWLT are in this state. The PMOS Q1 is turned off, the NMOS Q2 is turned on and the NMOS Q3 is turned on. The word line is in the non-selected state of the negative voltage $V_{KK}$ through the NMOS Q2 and the NMOS Q3.

(4) A Non-Selected State Example 2 of the Word Line (the Word Line Signal SWLT1-3) in the Case of the Above (1)

When the main word line signal MWLB0 and the sub word signals FXB1-3 are the negative voltage $V_{KK}$ and the high voltage $V_{PP}$, the word line signal SWLT1-3 keeps the non-selected state. In the sub word driver circuits SWD2-1, 2-2, and 2-3 that different sub word line signal FXB1-3 is connected although being connected with the main word line signal MWLB0, the main word line signal MWLB0 is switched from the high voltage $V_{PP}$ to the negative voltage $V_{KK}$ and the NMOS Q2 is turned off, as shown in FIG. 9A. However, as shown in FIGS. 9L, 9M and 9N, the word line signal SWLT1, SWLT2, and SWLT3 maintains the non-selected state of the negative voltage $V_{KK}$ through the NMOS Q3 because the sub word signal FXB1-3 of the high voltage $V_{PP}$ is supplied to the gate of the NMOS Q3, and the NMOS Q3 is turned on, as shown in FIGS. 9E, 9G and 9I. Also, the sub word signal FXT1-3 of the ground voltage $V_{SS}$ is supplied to the source of the PMOS Q1 through the inverter 4-1, 4-2, and 4-3 arranged in the intersection area (ISC), as shown in FIGS. 9F, 9H, and 9J. At this time, the negative voltage $V_{KK}$ is applied to the gate of the PMOS Q1, the ground voltage $V_{SS}$ is applied to the source thereof and the negative voltage $V_{KK}$ is applied to the drain thereof. However, in this embodiment, the negative voltage $V_{KK}$ is −0.3 V, the ground voltage $V_{SS}$ is 0 V and the voltage between the source and the drain in the PMOS Q1 is about 0.3 V. The PMOS Q1 is turned off when the substrate (well) is back-biased to 3.1 V at this time. Therefore, because the NMOS Q3 is turned on, the word line is set to the non-selected state of the negative voltage $V_{KK}$. Because the sub word signal FXB1-3 does not change from the high voltage $V_{PP}$, the word line non-selection speed is not limited due to the use of the NMOS Q3 with the high threshold voltage $V_{th}$.

(5) A Non-Selected State Example 3 of the Word Line (Word Line Signal SWLTn-3)

When the main word line signal MWLB0 and the sub word signal FXB0 maintain the high voltage $V_{PP}$ and the ground voltage $V_{SS}$, respectively, the word line signal SWLTn-3 maintains the non-selected state. The sub word driver circuit 2-(n-3) is connected with the main word line signal MWLBn-3 different from the main word line signal MWLB0 and the same sub word signal FXB0 is connected. First, the sub word line signal FXB0 is switched from the high voltage $V_{PP}$ to the ground voltage $V_{SS}$ and the NMOS Q3 is turned off. However, the word line signal maintains the non-selected state of the negative voltage $V_{KK}$ through the NMOS Q2 because the main word line signal MWLB0 of the high voltage $V_{PP}$ is supplied to the gate of the NMOS Q2 and the NMOS Q2 is turned on. Also, the sub word signal FXT0 of the high voltage $V_{PP}$ is supplied to the source of the PMOS Q1 through the inverter 4-0 arranged in the intersection area (ISC). At this time, the high voltage $V_{PP}$ is applied to the gate of the PMOS Q1, the high voltage $V_{PP}$ is applied to the source thereof, the negative voltage $V_{KK}$ is applied to the drain thereof, but the PMOS Q1 is turned off which is back-biased with the high voltage $V_{PP}$ of 3.1 V. Therefore, the word line signal is set to the non-selected state of the negative voltage $V_{KK}$. The word line non-selected speed is not limited due to the use of the NMOS Q3 with the high threshold voltage $V_{th}$ because the sub word signal FXB0 is switched from the high voltage $V_{PP}$ to the ground voltage $V_{SS}$ but the word line signal maintains the non-selected state of the negative voltage $V_{KK}$ through the NMOS Q2.

In this embodiment, the voltage of the word line signal is switched from the high voltage $V_{PP}$ of the word line selection state to the negative voltage $V_{KK}$ of the non-selected state in a single step. In the conventional example, the voltage of the word line signal is switched from the high voltage $V_{PP}$ of the word line selection state to the negative voltage $V_{KK}$ of the non-selected state in 2 steps. That is, the voltage of the word line signal is switched to the ground voltage $V_{SS}$ once, and then switched to the negative voltage $V_{KK}$ of the non-selected state. However, as described above, the number of the main word line signals becomes a half, and the transition time to the negative voltage $V_{KK}$ can be made short through the effect of low resistance of the power supply wiring line of the negative voltage $V_{KK}$, compared with the conventional example, while the consumption current in the negative voltage $V_{KK}$ is same.

Next, the semiconductor memory device according to the second embodiment of the present invention will be described. The semiconductor memory device of the second embodiment is basically same as that of the first embodiment but differs in the structure of the inverter. In the second embodiment, in each of the inverters 4-0 to 4-3, the NMOS with the high threshold voltage is used as the NMOS Q12, like the NMOS Q3.

In the first embodiment, if the negative voltage $V_{KK}$ is −0.3 V, when the main word line signal MWLB0 and the sub word signal FXB1 are in the negative voltage $V_{KK}$ and the high voltage $V_{PP}$, the voltage between the source and the drain and the voltage between the source and the gate in the PMOS Q1 are about −0.3 V. At this time, if the back bias is about 3.1 V, the PMOS Q1 of the sub word driver is turned off. However, when the negative voltage $V_{KK}$ is deeper and the voltage between the source and the drain becomes larger, there is a possibility that the PMOS Q1 is turned on. As a result, a problem is caused that the word line signal SWLT1-3 is floated and risen from the negative voltage $V_{KK}$ to the ground voltage $V_{SS}$.

Figure 10:
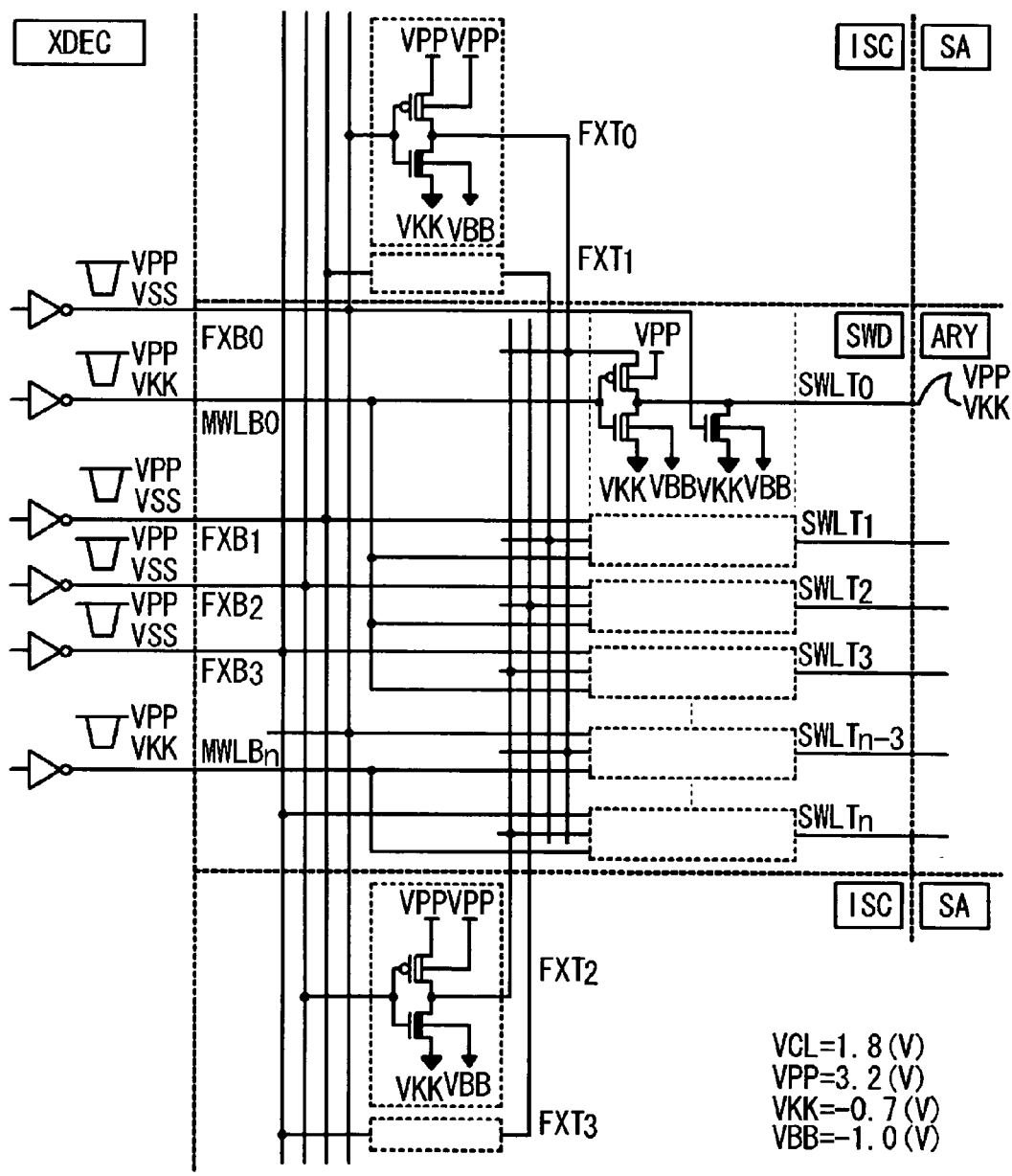
FIG. 10 is a diagram showing the wiring structure of the sub word driver circuit section in the semiconductor memory device according to a second embodiment of the present invention.

In the semiconductor memory device of the second embodiment, as shown in FIG. 10, an NMOS with the high threshold voltage $V_{th}$ is used as the NMOS Q12 of the inverter 4-0 in the intersection area (ISC). The source of the NMOS is connected with the negative voltage $V_{KK}$ and is back-biased to the negative voltage $V_{BB}$. In the second embodiment, the situation described in the (4) operation of the first embodiment is caused. That is, when the main word line signal MWLB0 and the sub word line signal FXB1-3 are in the negative voltage $V_{KK}$ and the high voltage $V_{PP}$, the sub word line signal FXB1-3 is set to the negative voltage $V_{KK}$. Thus, the voltage between the source and the drain and the voltage between the source and the gate in the PMOS Q1 are 0 V. As a result, the PMOS Q1 is turned off, the word line signal SWLT1-3 holds the non-selected state without changing from the negative voltage $V_{KK}$. In FIG. 10, as an example, the substrate voltage $V_{BB}$ is −1.0 V, and the negative voltage $V_{KK}$ is −0.7 V, but the present invention is not limited to these values.

In this way, in this embodiment, even when the negative voltage $V_{KK}$ is further lower, it is possible to realize the negative word correspondence CMOS sub word circuit by using the NMOS with the high threshold voltage $V_{th}$ and by setting the source voltage to the negative voltage $V_{KK}$ in FIG. 10.

In the present invention, the sub word driver circuit is composed of 3 transistors, the main word line signal MWLB, the sub word line signal FXB, and the sub word line signal FXT are supplied and the word line signal SWLT is outputted.

Figure 1:
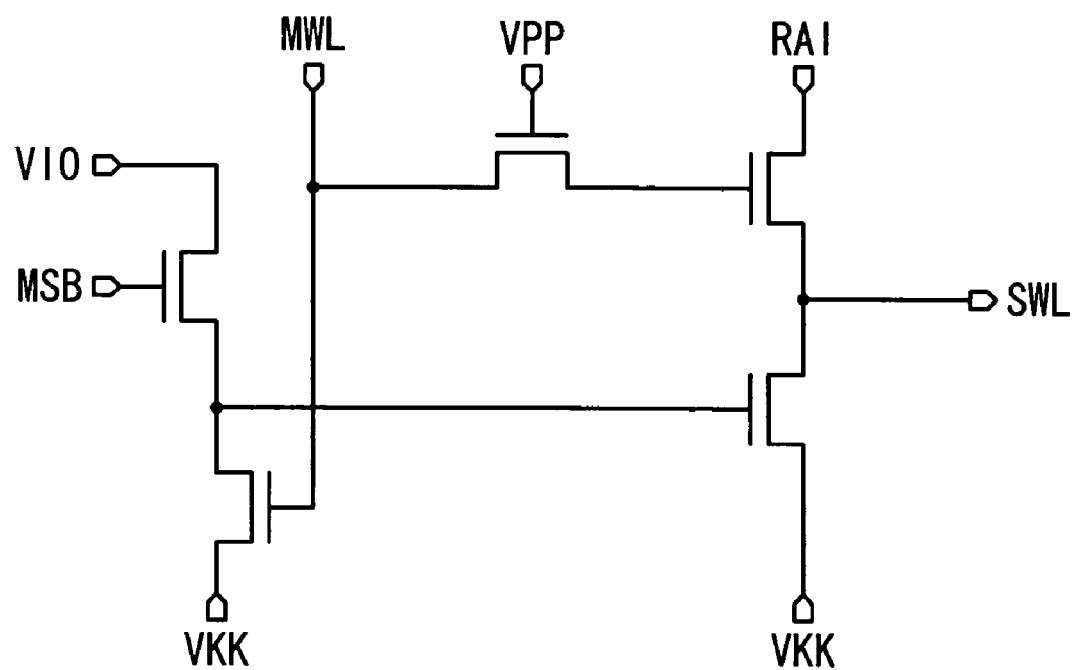
FIG. 1 is a circuit diagram showing a sub word driver circuit of a first conventional example.
Figure 2:
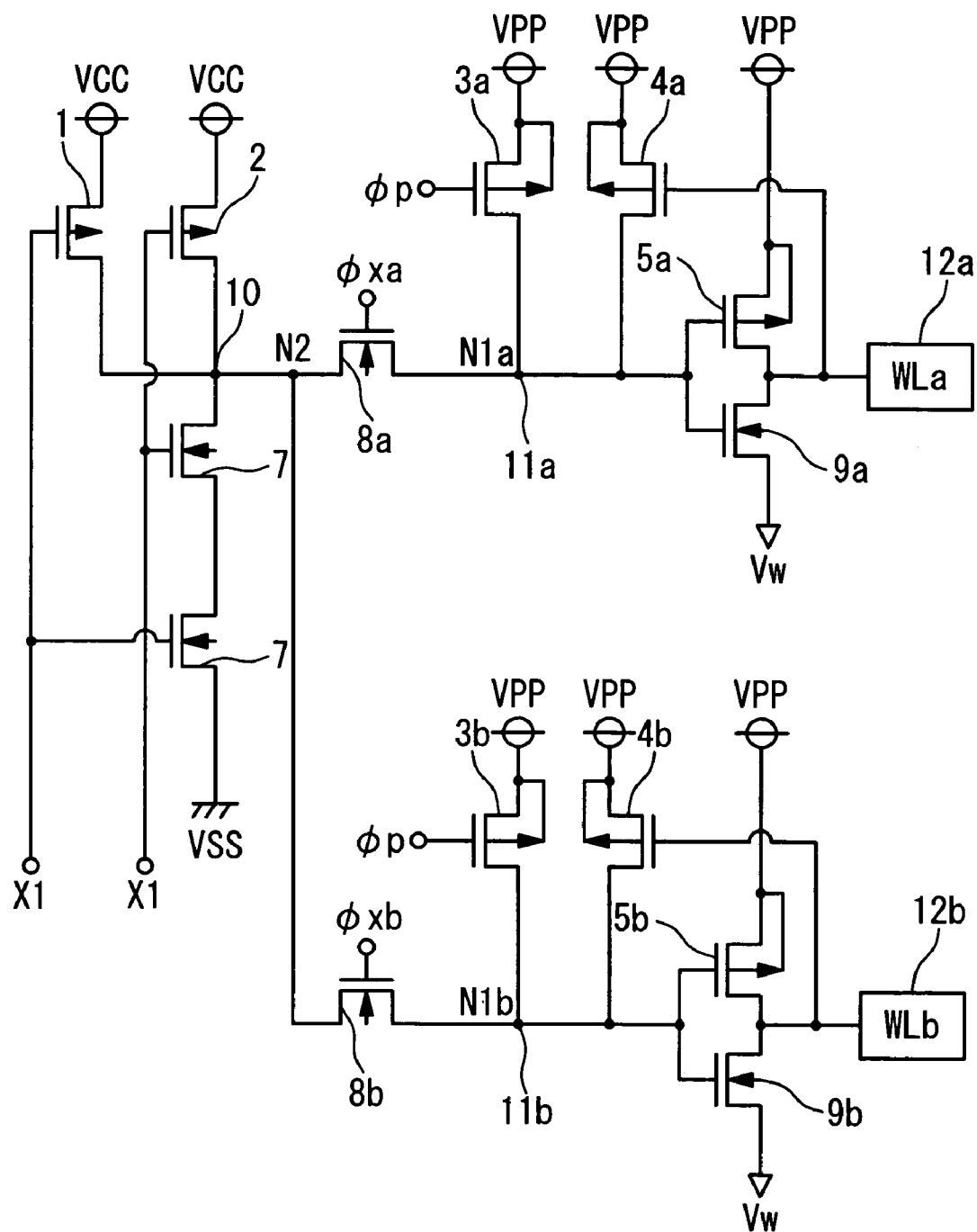
FIG. 2 is a circuit diagram showing another sub word driver circuit of a negative word system of a second conventional example.
Figure 3:
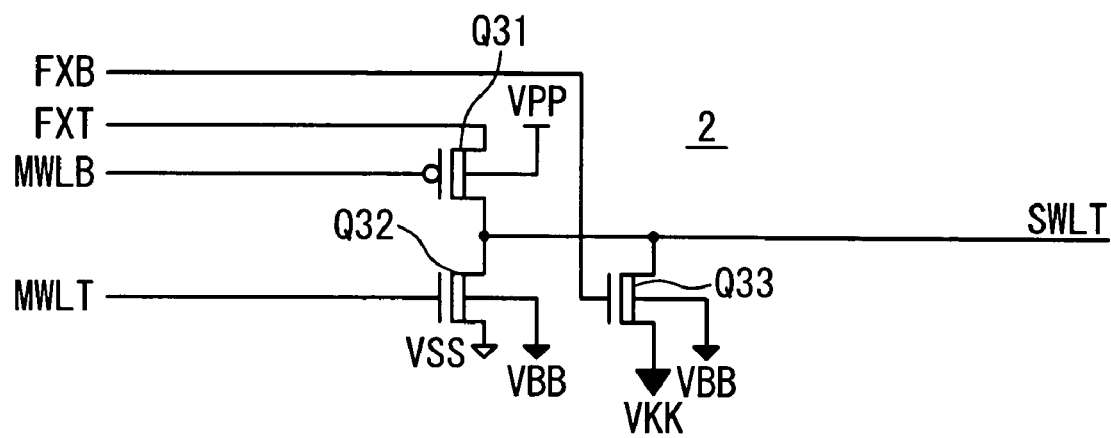
FIG. 3 is a circuit diagram showing a sub word driver circuit of the negative word system of a third conventional example.
Figure 4:
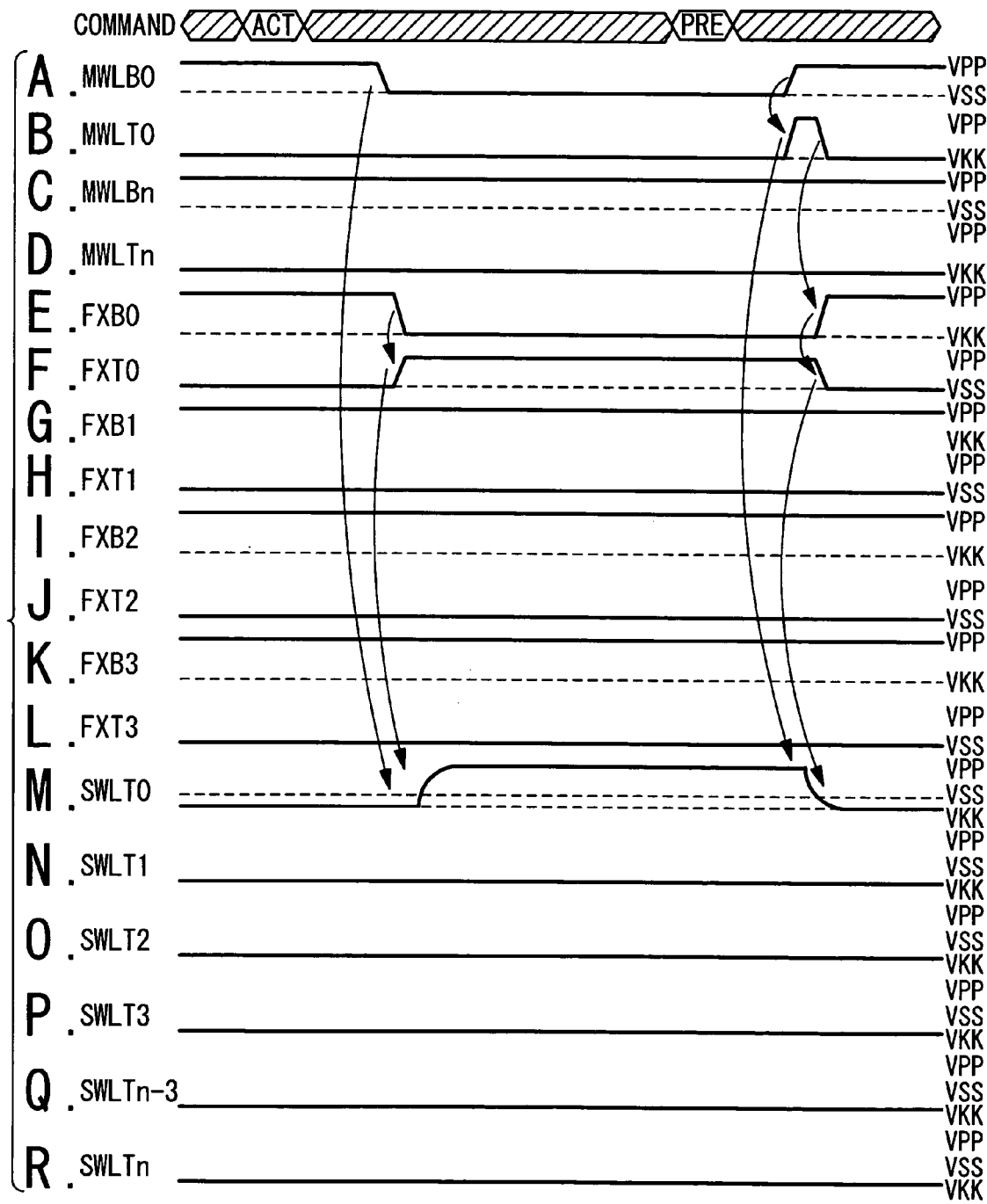
FIGS. 4A to 4R are diagram showing the operation of the third conventional example.
Figure 11:
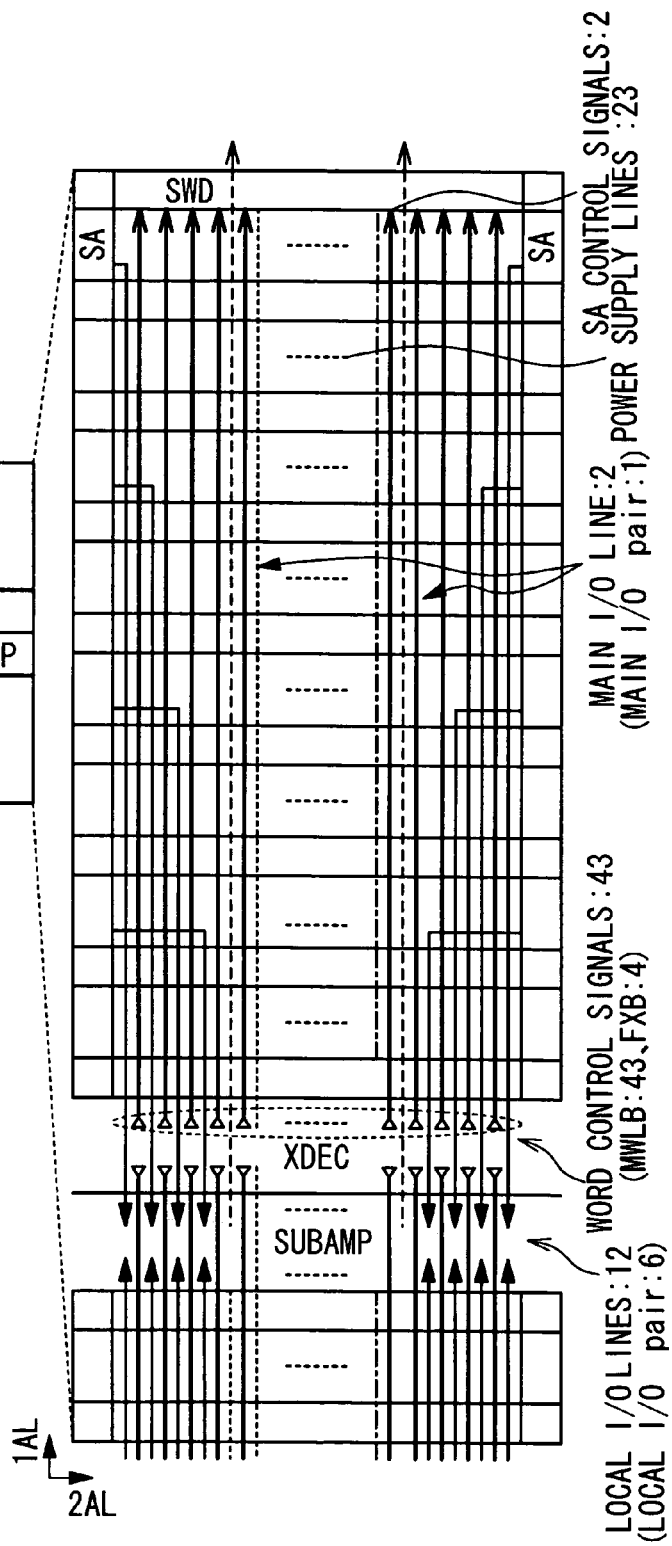
FIG. 11 is a diagram showing the wiring structure in the semiconductor memory device of the present invention.

In the present invention, because the main word line signal MWLT is unnecessary, compared with the conventional example shown in FIGS. 3 and 4, only the main word line signal MWLB is provided on the sub array. Therefore, the number of the wiring lines on the sub array can be reduced and the characteristics of the sub word driver are improved. FIG. 11 shows a chip floor plan in 1 Gbit DDR-I/II to which the present invention is applied. The word control signals (the main word line signal MWLB, the sub word signal FXB) are outputted from the X decoder XDEC at the center of the bank BANK by decoding a supplied address, and pass on the sub array ARY and are supplied to the sub word driver circuit SWD. As a result, the main word line signal can be made wide and the distance between the signals can be wider, compared with the conventional example. Therefore, it is possible to constrain the reduction of production yield due to the wiring line short-circuit accompanied by the fine process. Also, a delay time of the signal can be made small.

Also, in 1 Gbit DDR-I/II, the low SKEW design (the increase of the I/O stroke width) is indispensable for increase of the number of the I/O wiring lines and achievement of the high-speed operation. A rate of the I/O lines on the memory array becomes twice or more compared with the conventional example. The I/O lines are arranged in parallel to the word control signal between the sub array and a peripheral circuit through the sub amplifier SUBAMP at the center of the bank BANK. Therefore, when the present invention is applied, low resistance of the I/O lines can be realized by widening the I/O line width on the sub array, resulting in the high-speed data transfer. Also, noise endurance is improved. Moreover, the switching time of the word line to the negative voltage $V_{KK}$ in the non-selection can be reduced.

Also, in the sub word driver circuit of the present invention, the negative word system is realized by using the NMOS with the high threshold voltage which is higher than the usual threshold voltage for the NMOS Q3, while a transistor with a usually threshold voltage $V_{th}$ is used for the PMOS Q1 and the NMOS Q2 of the inverter. The NMOS Q3 with the high threshold voltage is formed simultaneously with implantation of boron into the memory cell transistor and has the same threshold voltage as that of the memory cell transistor. In the negative word correspondence sub word driver circuit, the sub word signal FXB which has the amplitude between the ground voltage $V_{SS}$ and the high voltage $V_{PP}$ is supplied to the gate of the NMOS with the high threshold voltage. The signal which has the amplitude between the negative voltage $V_{KK}$ and the high voltage $V_{PP}$ is only the main word line signal MWLB and the charging and discharging operation currents to the negative voltage $V_{KK}$ are decreased. The negative voltage $V_{KK}$ is the negative voltage of an optional level between the ground voltage $V_{SS}$ and the negative voltage $V_{BB}$.

As described above, the NMOS Q3 with the high threshold voltage is formed simultaneously with implantation of boron into the memory cell transistor. Therefore, the NMOS Q3 with the high threshold voltage can be formed without being accompanied by the increase of the manufacturing process. In this case, even when the deviation in threshold voltage occurs through the implantation of boron, the operation speed of the NMOS Q3 with the high threshold voltage changes but does not influence the word selection/non-selection speed.

Also, without being influenced by the operation speed the NMOS Q3 with the high threshold voltage, the voltage of the word line signal is boosted to voltage $V_{PP}$ through the PMOS Q1 with the usual threshold voltage in the word line selection, and is downed to the negative voltage $V_{KK}$ through the NMOS Q2 with the usual threshold voltage in the word line non-selection. Therefore, the sub word driver circuit corresponding to the negative word system can be realized without influencing the word selection/non-selection speed by using the NMOS Q3 with the high threshold voltage.

Also, the sub word signal FXB may be a signal that the low level is the ground voltage $V_{SS}$, by using the NMOS Q3 with the high threshold voltage. Therefore, because the number of signals with the amplitude to the negative voltage $V_{KK}$ decreases, the increase of the negative voltage $V_{KK}$ consumption current can be restrained.

What is claimed is:

1. A sub word driver circuit in a semiconductor memory device of a hierarchy word structure using a main word line signal and a sub word line signal, comprising:
    a first NMOS transistor and a first PMOS transistor which are connected in series; and
    a second NMOS transistor which is connected with a node between said first PMOS transistor and said first NMOS transistor,
    wherein a source of said first PMOS transistor is connected with a sub word line inverted signal obtained by inverting said sub word line signal, and a source of said first NMOS transistor is connected with a first negative voltage,
    a single main word line signal is connected to a gate of said first PMOS transistor and a gate of said first NMOS transistor, and
    said sub word line signal is connected with a gate of said second NMOS transistor;
    wherein:
    a source of said second NMOS transistor is connected with said first negative voltage;
    said first PMOS transistor and said first NMOS transistor have a first threshold voltage and a second threshold voltage, respectively, and
    said second NMOS transistor has a third threshold voltage which is higher than said second threshold voltage.

2. The sub word driver circuit according to claim 1, wherein said first PMOS transistor is back-biased to a positive voltage corresponding to a high level of said main word line signal, and
    said first NMOS transistor and said second NMOS transistor are back-biased to a second negative voltage equal to or lower than said first negative voltage.

3. The sub word driver circuit according to claim 1, wherein said second threshold voltage of said second NMOS transistor is substantially equal to a threshold voltage of a transistor in a memory cell.

4. A sub word driver circuit in a semiconductor memory device of a hierarchy word structure using a main word line signal and a sub word line signal, comprising:
    a first NMOS transistor and a first PMOS transistor which are connected in series; and
    a second NMOS transistor connected between a first negative voltage and a node between said first PMOS transistor and said first NMOS transistor,
    wherein a source of said first PMOS transistor is connected with a sub word line inverted signal obtained by inverting said sub word line, and
    a single main word line signal is connected to a gate of said first PMOS transistor and a gate of said first NMOS transistor and said sub word line signal is connected to a gate of said second NMOS transistor.

5. The sub word driver circuit according to claim 4, wherein said source of said first NMOS transistor is connected with said first negative voltage.

6. The sub word driver circuit according to claim 4, wherein said first PMOS transistor is back-biased to a positive voltage corresponding to a high level of said main word line signal, and
    said first NMOS transistor and said second NMOS transistor are back-biased to a second negative voltage equal to or lower than said first negative voltage.

7. The sub word driver circuit according to claim 4, wherein said first PMOS transistor and said first NMOS transistor have a first threshold voltage and a second threshold voltage, respectively, and said second NMOS transistor has a third threshold voltage which is higher than said second threshold voltage.

8. The sub word driver circuit according to claim 7, wherein said second threshold voltage of said second NMOS transistor is substantially equal to a threshold voltage of a transistor in a memory cell.

9. A semiconductor memory device comprising:
a decoder which decodes an address to activate one of main word line signals and one of sub word signals for a memory cell sub array;
a first inverter which comprises a first PMOS transistor and a first NMOS transistor and which are connected with a first positive voltage, and inverts said activated sub word signal to generate a sub word line inverted signal;
a second inverter which comprises a second PMOS transistor and a second NMOS transistor, is connected between said sub word line inverted signal and a first negative voltage, and inverts said activated main word line signal to output an active word line signal which is supplied to said memory cell sub array; and
a third NMOS transistor which is connected between the output of said second inverter and said first negative voltage and has a gate receiving said activated sub word line signal;
wherein a source of said second NMOS transistor is connected with said first negative voltage;
said second NMOS transistor has a first threshold voltage, and said third NMOS transistor has a second threshold voltage which is larger than the threshold voltage of said first threshold voltage.

10. The semiconductor memory device according to claim 9, wherein each of said first and second PMOS transistors is back-biased to said first positive voltage, and each of said first to third NMOS transistors is back-biased to a second negative voltage equal to or lower than said first negative voltage.

11. The semiconductor memory device according to claim 9, wherein a source of said first NMOS transistor is connected with a ground voltage.

12. The semiconductor memory device according to claim 11, wherein said first and second NMOS transistors have a first threshold voltage, which is substantially the same as that of said first or second PMOS transistor.

13. The semiconductor memory device according to claim 9, wherein said second NMOS transistor has a first threshold voltage, and each of said first and third NMOS transistors has a second threshold voltage which is larger than said first threshold voltage.

14. The semiconductor memory device according to claim 9, wherein said second threshold voltage of each of said first and third NMOS transistors is substantially equal to a threshold voltage of a transistor in a memory cell.

15. The semiconductor memory device according to claim 9, wherein said activated main word line signal, said activated sub word signal and said active word line signal pass on a memory cell array containing said memory cell sub array.

* * * * *